(12) United States Patent
Woo et al.

(10) Patent No.: US 9,359,211 B2
(45) Date of Patent: Jun. 7, 2016

(54) METHODS OF FABRICATING GRAPHENE USING ALLOY CATALYST

(75) Inventors: Yun-sung Woo, Suwon-si (KR); David Seo, Yongin-si (KR); Sun-ae Seo, Hwaseong-si (KR); Hyun-jong Chung, Hwaseong-si (KR); Sae-ra Kang, Asan-si (KR); Jin-seong Heo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 143 days.

(21) Appl. No.: 12/805,084

(22) Filed: Jul. 12, 2010

(65) Prior Publication Data
US 2011/0108609 A1 May 12, 2011

(30) Foreign Application Priority Data
Nov. 10, 2009 (KR) .................. 10-2009-0108231

(51) Int. Cl.
| | |
|---|---|
| *C01B 31/04* | (2006.01) |
| *B82Y 30/00* | (2011.01) |
| *B82Y 40/00* | (2011.01) |
| *C23C 16/02* | (2006.01) |
| *C23C 16/26* | (2006.01) |
| *B01J 23/755* | (2006.01) |
| *B01J 37/34* | (2006.01) |

(52) U.S. Cl.
CPC ............. *C01B 31/0453* (2013.01); *B82Y 30/00* (2013.01); *B82Y 40/00* (2013.01); *C23C 16/0281* (2013.01); *C23C 16/26* (2013.01); *B01J 23/755* (2013.01); *B01J 37/347* (2013.01); *C01B 2204/04* (2013.01)

(58) Field of Classification Search
None
See application file for complete search history.

(56) References Cited

U.S. PATENT DOCUMENTS

| | | | | |
|---|---|---|---|---|
| 2003/0148097 | A1* | 8/2003 | Takikawa et al. | 428/364 |
| 2008/0223287 | A1* | 9/2008 | Lavoie et al. | 117/94 |
| 2009/0047520 | A1 | 2/2009 | Lee et al. | |
| 2009/0068471 | A1* | 3/2009 | Choi et al. | 428/408 |
| 2010/0055464 | A1* | 3/2010 | Sung | 428/408 |
| 2010/0101710 | A1* | 4/2010 | Choi et al. | 156/230 |
| 2011/0244210 | A1 | 10/2011 | Choi et al. | |

FOREIGN PATENT DOCUMENTS

| | | |
|---|---|---|
| JP | 2008-050228 | 3/2008 |
| JP | 2009-091174 | 4/2009 |

(Continued)

OTHER PUBLICATIONS

Reina (Nano Letters (2009) vol. 9. No. 1. p. 30-35 (published online Dec. 1, 2008)).*

(Continued)

*Primary Examiner* — Joel Horning
(74) *Attorney, Agent, or Firm* — Harness, Dickey & Pierce P.L.C.

(57) ABSTRACT

Methods of fabricating graphene using an alloy catalyst may include forming an alloy catalyst layer including nickel on a substrate and forming a graphene layer by supplying hydrocarbon gas onto the alloy catalyst layer. The alloy catalyst layer may include nickel and at least one selected from the group consisting of copper, platinum, iron and gold. When the graphene is fabricated, a catalyst metal that reduces solubility of carbon in Ni may be used together with Ni in the alloy catalyst layer. An amount of carbon that is dissolved may be adjusted and a uniform graphene monolayer may be fabricated.

8 Claims, 2 Drawing Sheets

(56) References Cited

FOREIGN PATENT DOCUMENTS

| KR | 10-2009-0026568 | 3/2009 |
| KR | 10-2009-0065206 | 6/2009 |
| KR | 2009-0103985 A | 10/2009 |

OTHER PUBLICATIONS

Miao, Thin Solid Films 484 (2005) 58-63.*
Li, Science 324 (Jun. 5, 2009) pp. 1312-1314.*
Chinese Office Action dated Jan. 21, 2014 issued in corresponding Chinese Application No. 201010504291.X (with English translation).
Korean Office Action dated Jul. 7, 2015 issued in corresponding Korean Patent Application No. 10-2009-0108231 (English translation provided).
Chinese Office Action dated Apr. 3, 2015 issued in corresponding Chinese Application No. 201010504291.X (with English translation).
Xuesong Li, et al. "Evolution of Graphene Growth on Ni and Cu by Carbon Isotope Labeling", Nano Letters, vol. 9, No. 12, pp. 4268-4272, (2009).

* cited by examiner

METHODS OF FABRICATING GRAPHENE USING ALLOY CATALYST

CROSS-REFERENCE TO RELATED APPLICATION

This application claims the benefit of Korean Patent Application No. 10-2009-0108231, filed on Nov. 10, 2009, in the Korean Intellectual Property Office (KIPO), the entire contents of which is incorporated herein by reference.

BACKGROUND

1. Field

Example embodiments relate to methods of fabricating graphene using an alloy catalyst layer.

2. Description of the Related Art

Graphene is a monolayer structure of carbon in which carbon atoms are in a chemically stable hexagonal (honeycomb) crystal lattice. The electrical characteristics of graphene are semi-metallic because the conduction band and valance band thereof overlap only at a Dirac point. The electron transport mechanism of graphene is ballistic and an effective mass of electrons is 0. Accordingly, graphene may be used as a channel having very high electron mobility in order to fabricate field effect transistors. An electric current of $10^8$ A/cm$^2$ that is 100 times greater than the largest current density of copper (Cu) may flow in graphene. Because a monolayer of graphene has a visible ray absorption level of about 2% a graphene layer is transparent. In addition, graphene is considered to be a stiff material in view of its Young's modulus of about 1 Pa.

Due to the above physical, optical, and mechanical characteristics of graphene, graphene may be applied in various fields. In order to widely utilize graphene, a simple manufacturing process for large area graphene monolayers having a low and/or decreased number of defects is required.

Recently, graphene has been manufactured by depositing a graphene layer on a catalyst metal such as nickel (Ni), copper (Cu), or platinum (Pt) using a chemical vapor deposition (CVD) method. However, in this method, graphene and graphite are mixed during the fabrication process and it is difficult to synthesize a uniform graphene monolayer.

SUMMARY

Example embodiments include methods of fabricating a large area graphene monolayer using an alloy catalyst.

According to example embodiments, a method of fabricating graphene using an alloy catalyst layer may include forming an alloy catalyst layer on a substrate and forming a graphene layer by supplying hydrocarbon gas onto the alloy catalyst layer.

The alloy catalyst layer may include at least two metal materials selected from transition metals. The alloy catalyst layer may be formed of at least two metal materials selected from the group consisting of nickel (Ni), copper (Cu), platinum (Pt), iron (Fe), and gold (Au). The alloy catalyst layer may include Ni of about 5 to about 30 atomic %. The alloy catalyst layer may be a Ni—Cu alloy layer. In the forming of the alloy catalyst layer, the alloy catalyst layer may be formed to a thickness of about 10 to about 1000 nm. The alloy catalyst layer may be formed by a sputtering method or an evaporation method. The forming of the graphene layer may be performed at a temperature of about 650° C. to about 750° C.

According to example embodiments, a method of fabricating grapheme may include forming an alloy catalyst layer on a substrate and forming a graphene layer on the alloy catalyst layer.

BRIEF DESCRIPTION OF THE DRAWINGS

Example embodiments will be more clearly understood from the following brief description taken in conjunction with the accompanying drawings.

FIGS. 1 and 2 are cross-sectional diagrams illustrating methods of fabricating graphene using an alloy catalyst layer according to example embodiments; and FIG. 3 is a Raman spectrum graph of graphene fabricated using a method according to example embodiments.

Figure 1:
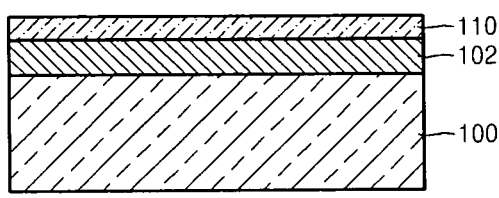
FIGS. 1-3 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
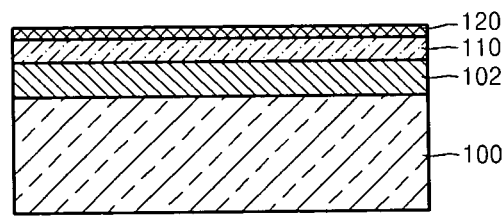

FIGS. 1 and 2 are cross-sectional diagrams illustrating methods of fabricating graphene using an alloy catalyst layer according to example embodiments. Referring to FIG. 1, a substrate 100 may be prepared. A silicon substrate with a thickness of about 650 µm may be used as the substrate 100. An oxide layer may be formed on the silicon substrate 100. For example, the silicon substrate 100 may be oxidized in order to form a silicon oxide layer 102 on the silicon substrate 100. The silicon oxide layer 102 may be from about 100 nm to about 300 nm in thickness. The substrate 100 of the present embodiment is not limited to the silicon substrate. For example, a sapphire substrate may be used as the substrate 100.

An alloy layer 110 including, for example, nickel (Ni) and copper (Cu) may be formed on the silicon oxide layer 102. About 5 to about 30 atomic % of Ni may be included in the alloy layer 110. If Ni is used as the sole catalyst material in a graphene fabrication processes carbon may dissolve into the Ni. The carbon may be segregated from Ni using a cooling process to form graphene on a surface of the Ni. It may be difficult to adjust the thickness of graphene in a Ni-only catalyst process due to the high solubility of carbon in Ni. Flake graphene, a multi-layered graphene, may be partially formed in the monolayer graphene.

Copper (Cu) included in an alloy layer 110 may act as a catalyst in a decomposition operation of hydrocarbon and may have low carbon solubility. When an alloy of Ni and Cu is used as the catalyst, Cu may restrain dispersion of the carbon into the Ni. Ni may increase a growth speed of the graphene in a Cu catalyst.

If the alloy layer 110 includes 5 atomic % or less of Ni, the hydrocarbon may not decompose well. If the alloy layer 110 includes 30 atomic % or greater Ni, a decomposition speed of the hydrocarbon may be too fast and the carbon solubility may increase. It may be difficult to form a uniform graphene monolayer and to control the thickness of the fabricated graphene. When about, for example, 20 atomic % of Ni is included in the alloy layer 110, the graphene monolayer may be uniform and thickness of the graphene may be well controlled.

When an alloy layer 110 including Ni is used as a catalyst layer, the graphene may be fabricated at a low temperature.

An alloy layer 110 may be formed by, for example, co-sputtering Cu and Ni on a substrate 100. An alloy layer 110 may be formed by alternately stacking a Cu thin film and a Ni thin film on a substrate 100 and annealing the alternately stacked thin films. The Cu and Ni thin films may be alternately stacked by using, for example, a sputtering method, an evaporation method, and/or a CVD method. The Cu thin film may be thicker than the Ni thin film. An alloy layer 110 may be formed to a thickness of, for example, about 10 nm to about 1000 nm.

Referring to FIG. 2, a hydrocarbon gas may be supplied into a chamber of a CVD apparatus to form a graphene layer 120 on an alloy layer 110. The hydrocarbon gas may be, for example, acetylene gas. A carrier gas may be supplied with the hydrocarbon gas. For example, argon (Ar) may be used as a carrier gas. The acetylene gas and Ar may be supplied, for example, in a ratio of 1:40 sccm. During formation of the graphene layer 120 the substrate 100 may be maintained at, for example, a temperature of about 650° C. to about 750° C. The graphene layer 120 (e.g., a monolayer) may be formed to a thickness of, for example, about 0.3 nm to about 1 nm.

Figure 3:
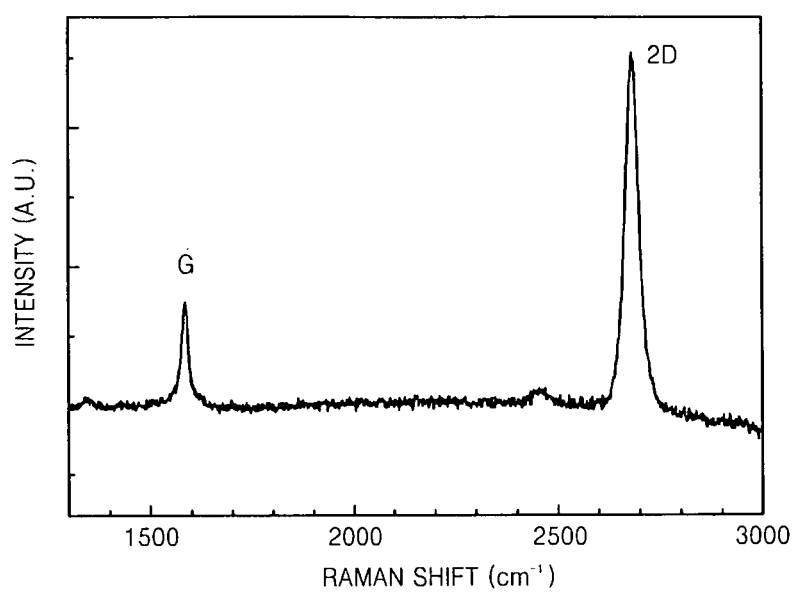

FIG. 3 is a graph showing a Raman spectrum of a graphene layer fabricated on a silicon substrate using an alloy layer including 20 atomic % of Ni and 80 atomic % of Cu. The Raman spectrum graph of FIG. 3 may be nearly the same as a Raman spectrum graph of a graphene layer that is obtained by peeling-off and rubbing Kish graphite. In the Raman spectrum graph of FIG. 3, a D peak (1350 cm$^{-1}$ peak) may barely exist. A G peak (1580 cm$^{-1}$ peak) and a 2D peak (2700 cm$^{-1}$ peak) may be highly represented. A 2D/G peak ratio is equal to or greater than 3, indicating the presence of monolayer graphene.

According to example embodiments the alloy layer 110 may include Ni and Cu. Example embodiments are not limited to Ni and Cu. A transition metal (e.g., iron (Fe), platinum (Pt), and/or gold (Au)) may be used as a material for restraining the catalyst operation of Ni. According to example embodiments, at least two or more metal materials having different carbon solubility with respect to each other and selected from transition metals may be included in the alloy layer.

According to example embodiments, a catalyst metal that may reduce the carbon decomposition of Ni may be used with Ni. An amount of carbon dissolved by the alloy catalyst layer may be adjusted. A uniform graphene monolayer having a large area may be manufactured.

While example embodiments have been particularly shown and described, it will be understood by one of ordinary skill in the art that variations in form and detail may be made therein without departing from the spirit and scope of the claims.

What is claimed is:

1. A method of fabricating graphene, the method comprising:
    forming an alloy catalyst layer on a substrate, the alloy catalyst layer made of a Ni—Cu alloy; and
    forming a graphene monolayer on the alloy catalyst layer by supplying hydrocarbon gas onto the substrate at a temperature of about 650° C. to about 750° C. using chemical vapor deposition (CVD), the alloy catalyst layer including about 5 atomic % to about 30 atomic % of nickel (Ni).

2. The method of claim 1, wherein the alloy catalyst layer includes about 20 atomic % of Ni.

3. The method of claim 1, wherein the forming of the alloy catalyst layer includes forming the alloy catalyst layer to a thickness of about 10 nm to about 1000 nm.

4. The method of claim 1, wherein the forming of the alloy catalyst layer includes forming the alloy catalyst layer using one of a sputtering method and an evaporation method.

5. The method of claim 1, wherein the forming of the alloy catalyst layer includes forming the Ni—Cu alloy catalyst layer by stacking a Ni film and a Cu film on the substrate, and annealing the stacked thin films.

6. The method of claim 5, wherein the forming of the Ni—Cu alloy catalyst layer includes forming the stacked films by stacking a first plurality of Ni thin films with a second plurality of Cu thin films so that the first Ni thin film and the second pluralities of Cu thin films are interleaved.

7. The method of claim 6, wherein the first plurality of Ni thin films are a different thickness than the second plurality of Cu thin films.

8. The method of claim 7, wherein each of the first plurality of Cu thin films is thicker than the plurality of Ni thin films.

* * * * *